US006580336B1

(12) United States Patent
Gerszberg et al.

(10) Patent No.: US 6,580,336 B1
(45) Date of Patent: Jun. 17, 2003

(54) METHOD AND APPARATUS FOR PROVIDING UNINTERRUPTED SERVICE IN A HYBRID FIBER COAXIAL SYSTEM

(75) Inventors: Irwin Gerszberg, Kendall park, NJ (US); Jeffrey S. Martin, Dover, NJ (US); Thomas Oplinger, Morristown, NJ (US); Philip Andrew Treventi, Murray Hill, NJ (US); Hopeton S. Walker, Haledon, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/224,289

(22) Filed: Dec. 31, 1998

(51) Int. Cl.[7] .............................. H01P 5/12; H03H 7/00

(52) U.S. Cl. ........................ 333/100; 333/136; 333/105

(58) Field of Search ................................ 333/100, 132, 333/136, 24 R, 105, 124, 127

(56) References Cited

U.S. PATENT DOCUMENTS 5,058,198 A * 10/1991 Rocci et al. ................ 725/149
5,648,745 A * 7/1997 Spriester et al. ............ 333/100
5,756,935 A * 5/1998 Balanovsky et al. ....... 174/52.1
5,814,905 A 9/1998 Tang .......................... 307/147
5,850,165 A * 12/1998 Spriester et al. ............ 333/100
5,909,154 A * 6/1999 Brown et al. ............... 333/100
6,024,604 A * 2/2000 Chilton et al. .............. 439/579
6,025,760 A * 2/2000 Tang .......................... 333/100

* cited by examiner

*Primary Examiner*—Robert Pascal
*Assistant Examiner*—Dean Takoaka

(57) ABSTRACT

Method and apparatus for providing uninterrupted, attenuated RF signal and AC power to downstream multiple port taps, while an upstream multiple port tap is being serviced. A multiple port tap includes a tap housing, an assembly for receiving a main signal from an upstream element and an assembly for outputting the main signal to a downstream element. The tap also includes circuitry that couples the signal receiving assembly to the signal outputting assembly. The tap circuitry used in the tap includes a signal attenuator for maintaining a level predetermined RF signal and AC power level across the tap. A housing cover plate is positioned on the housing for covering the main opening to the housing. The cover plate includes at least one subscriber connection port operatively coupled to the circuitry for delivering a signal to a subscriber. The tap further includes a signal and power bypass having a variable attenuator for coupling to the signal receiving means and signal outputting means. The bypass creates a signal and power pathway around the circuitry so that uninterrupted service is provided to the downstream element while the tap is removed and the tap is being serviced.

17 Claims, 9 Drawing Sheets

METHOD AND APPARATUS FOR PROVIDING UNINTERRUPTED SERVICE IN A HYBRID FIBER COAXIAL SYSTEM

FIELD OF THE INVENTION

The field of the present invention relates generally to broadband distribution equipment for use with a telephone communication system involving a coaxial drop cable and, more specifically, to a method and apparatus for providing continuous power and bandwidth transmission downstream of a subscriber while a coaxial, multiple port "tap" is being serviced.

BACKGROUND OF THE INVENTION

Multiple port taps are known in cable television networks for tapping off a main signal feeding coaxial cable to provide a signal to a respective number of customers. These taps can include one port, two ports, four ports or eight ports. In a typical cable television distribution system, a plurality of these multiple port tap devices are connected as required along the length of the main signal and power feeding line for tapping and distributing television signals to a plurality of the customers. Typically, the main signal feeding cable is passed into the multiple port tap at an input port along the side of the tap, and the main signal feeding cable is continued from an output port on the opposite side of the tap. The feeding cable that extends from the output port of one tap extends into the input port of the next, downstream multiple port tap. As more customers are added to conventional systems, it can become necessary for the line to be lengthened, spliced, etc., and/or for the level of power of the signal being conducted by the main cable to be increased. It is also known to have the main distribution cable conduct both the television or RF signal along with the AC power necessary to energize the electronic circuitry of any active devices in the network.

Conventional multiple port taps require the cover plate to be removed when any type of service is performed. Removal of the cover plate results in an interruption of the signal and power to downstream subscribers. Typical service includes, but is not limited to diagnostic testing, substituting a new cover plate and circuit board for a defective one, repairing a particular output tap connector, and changing the impedance across the tap. A proper impedance level across a tap must be maintained so that an appropriate signal level is provided to the subscribers connected to the tap and downstream of the tap. An appropriate impedance level is also required so that an appropriate downstream power level is maintained for activating devices such as amplifiers. Without appropriate signal and power levels being transmitted from a tap, the service to customers directly fed by the tap and those downstream of the tap will be interrupted until the servicing of the tap under repair or conversion is completed.

Many attempts have been made to overcome this problem. These include providing a conventional tap with a built-in, manually closeable switching mechanism that, for example, after a tap plate is removed, reconnects the RF signal and AC power to the downstream taps. However, the manually closable switch does not provide continuous, uninterrupted service of the RF signal and AC power to the downstream taps and subscribers. Instead, the signal and power are interrupted until the switching mechanism can be activated. U.S. Pat. No. 5,677,578 to Tang discloses a multi-port tap intended to provide continuous, uninterrupted RF signal and AC power to downstream taps and subscribers. The multi-port tap of Tang uses a shunt printed circuit board having a conductive path for RF signal and AC power. The shunt board is biased into contact with the main feed line as the tap plate is removed. A major drawback to the multi-port tap of Tang is its inability to attenuate the RF signal in order to accurately compensate for the signal loss due to the removal of the face plate. Because the signal is not attenuated to the value of the face plate, service to some downstream providers will be interrupted while the face plate is removed. Also, the multi-port tap of Tang and the prior art taps do not include a service port that allows for diagnostic procedures to be performed or attenuation values to be changed without removing the tap plate.

There is a need for a multiple port tap for use with a communication system that overcomes the drawbacks of the prior art. In particular, there is a need for a multiple port tap that while being repaired provides continuous, uninterrupted RF signal and AC power to downstream taps and subscribers for the duration of the service or repair. There is also a need for such a multiple port tap that includes a variable attenuator for maintaining the impedance across the tap at a predetermined level equivalent to the value of the tap in question. Further, a multiple port trap including a diagnostic and attenuation adjustment service port is also needed so that the tap can be converted to a higher or lower attenuation factors without any interruption of RF signal and AC power to down the multiple port taps and subscribers.

SUMMARY OF THE INVENTION

An object of the invention is to provide a new and improved multiple port tap. Another object of the invention is to provide a multiple port tap that ensures uninterrupted, attenuated RF signal and AC power to downstream multiple port taps, whenever a tap plate of an upstream multiple port tap is removed. It is a further object of the present invention to provide such a tap including a signal and power bypass having a variable attenuator for changing the impedance in the bypass.

One embodiment of a multiple port tap according to the present invention includes a tap housing, means for receiving a main signal from an upstream element and means for outputting the main signal to a downstream element. The tap also includes circuitry that couples the signal receiving means to the signal outputting means. The tap circuitry used in the tap includes a signal attenuator for maintaining a predetermined RF signal and AC power level across the tap. A housing cover plate is positioned on the housing for covering the main opening to the housing. The cover plate includes at least one subscriber connection port operatively coupled to the circuitry for delivering a signal to a subscriber. The tap further includes a signal and power bypass having a variable attenuator for coupling to the signal receiving means and signal outputting means. The bypass provides a signal and power pathway around the circuitry so that uninterrupted service is provided to the downstream element while the tap is being serviced.

The bypass tap can either be completely positioned in the tap housing or it can be an external bypass secured to the housing through bypass ports. An external signal bypass according to the present invention comprises a first signal receiving end for coupling with the main signal input connector of the multiple port tap, a second signal receiving end for coupling with the main signal output connector of the multiple port tap, and a variable impedance attenuator positioned between the first and second signal receiving ends for delivering a predetermined signal and power to the main signal output connector of the multiple port tap when the tap is being serviced.

A second embodiment of the multiple port tap according to the present invention comprises a tap housing and cover plate removably secured to the tap housing. The tap also comprises a feeder signal input port for receiving an upstream line carrying a main feeder signal, a feeder signal output port for allowing passage of a downstream line carrying the main feeder signal to a downstream element, and a signal connection port positioned between the signal input port and the signal output port for receiving an end of each of the lines. An attenuating member is removably positioned within the connection port for establishing a RF signal and AC power flow path between the ends of the lines. The attenuating member has a preset impedance value for providing a feeder signal having a predetermined strength to a downstream element. The attenuating member according to this embodiment allows for the impedance of the tap to be quickly and easily changed without having to remove the cover plate from the housing. As discussed below, this embodiment can be used with either an internal or an external signal and power bypass.

A third embodiment of a tap for use in a coaxial communication system according to the present invention includes a main tap housing having an opening, an input signal connector operatively associated with an input port for receiving a main feeder signal, and an output signal connector operatively associated with an output port for delivering the main feeder signal to a downstream element. A main housing cover is removably secured to the main tap housing for closing the housing opening. The tap also includes circuitry for delivering the main feeder signal from the input signal connector to the output signal connector. Moreover, an externally accessible service port is operatively coupled to the circuitry so that a diagnostic analysis of the active tap can be performed while the main housing cover is secured to the main tap housing. The externally accessible service port can be used with any of the other tap embodiments according to the present invention for performing service on a multiple port tap without removing its cover plate.

The present invention also includes a method of providing a continuous, attenuated feeder signal across a tap in a coaxial communication system while the tap is serviced. The method comprises the steps of providing a tap including a housing having an open top, a cover plate removably secured to the housing for closing the open top, an input signal connection member for receiving the feeder signal, an output signal connection member for outputting the feeder signal to a downstream element and a printed circuit board for carrying the feeder signal between the signal connection members. The method also includes the steps of providing a signal bypass having first and second ends for coupling to a respective one of the signal connection members. The signal bypass also includes a variable attenuator positioned between its first and second ends. The method further includes the steps of coupling the first end of the signal bypass to the input signal connection member, coupling the second end of the signal bypass to the output signal connection member, and activating the signal bypass. Before the bypass is activated, the variable attenuator must be set at a predetermined impedance level. After the bypass has been activated, or as it is being activated, the circuit board is disconnected from the signal connection members so that the feeder signal flows from the input signal connection member to the output signal connection member through the signal bypass.

DETAILED OF PREFERRED EMBODIMENTS

Figure 1:
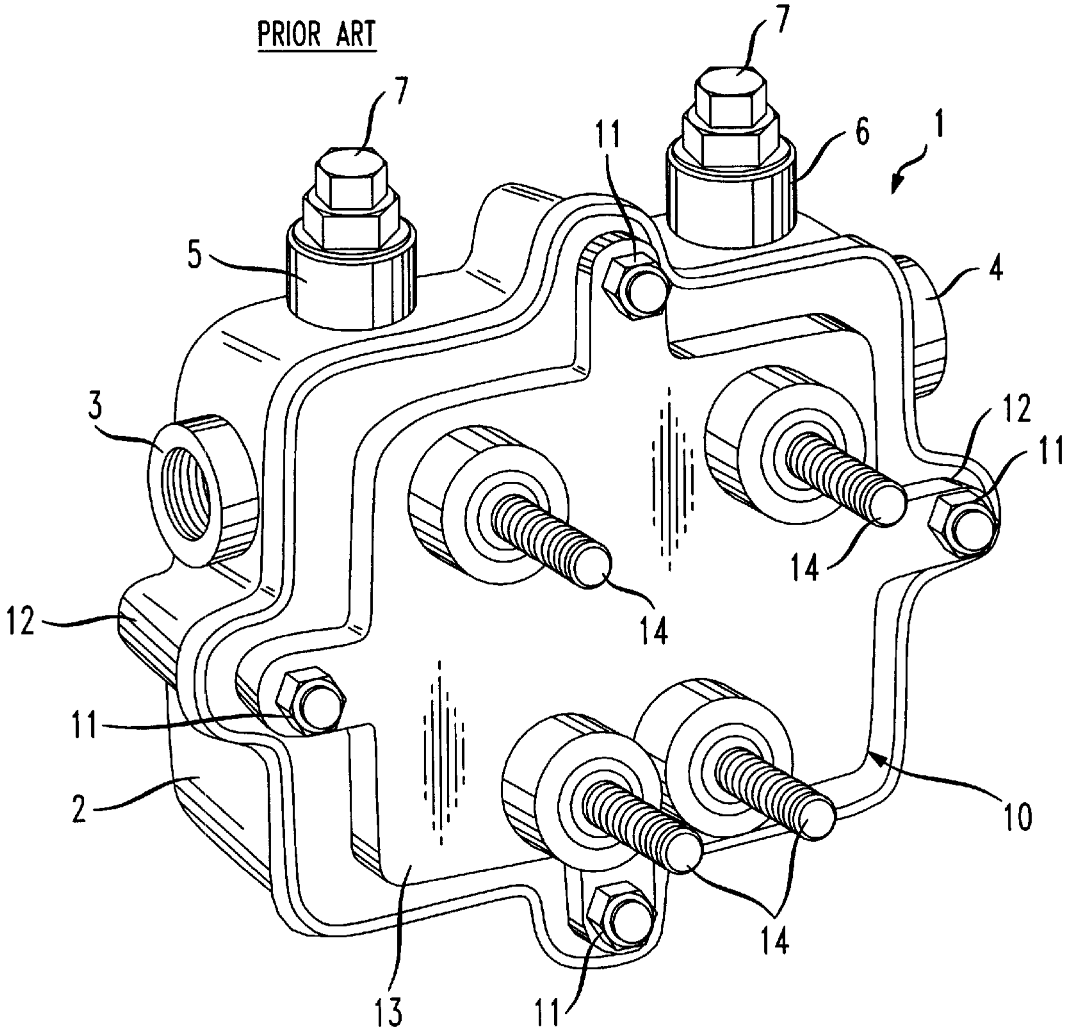
FIG. 1 PRIOR ART
FIG. 1 illustrates a multiple port tap according to a first embodiment of the present invention.
Figure 3:
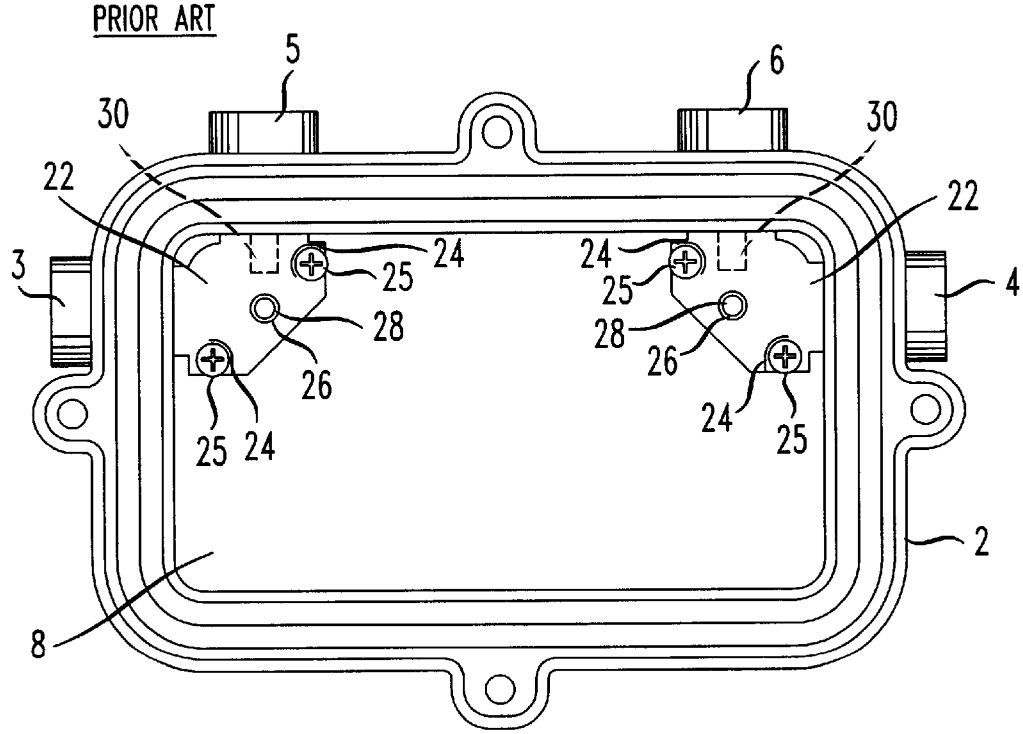
FIG. 3 PRIOR ART
FIG. 3 illustrates a first embodiment of the interior of a multiple port tap housing according to the present invention.

In FIG. 1, a conventional multiple port tap 1 is shown. Tap 1 includes a housing 2 having a plurality of through-ports including a main signal and power feeding line input port 3, a main signal and power feeding output port 4, a bypass input port 5, and a bypass output port 6. When not in use, each through-port 3–6 can be covered by a port cap 7 for protection. Housing 2 also includes an interior recess 8, as shown in FIG. 3, for supporting the internal circuitry of tap 1. A clamp plate (not shown) is secured to the back of tap housing 2 via a clamp fastener for securing tap 1 to an appropriate mounting post or member (not shown).

A tap cover plate 10 is attached to housing 2 by a plurality of fasteners 11 secured within a respective mounting boss 12. Fasteners 11 include any known fastener such as a bolt or a screw. An outer face 13 of cover plate 10 includes a plurality of subscriber connection ports, also known as tap connectors, 14 for delivering attenuated voice, video, data and cable TV signals to subscribers. Four connection ports 14 are shown in FIG. 1. However, any desired number of connection ports 14 may be provided for providing service to a corresponding number of subscribers. As discussed above, one port, two port and eight port cover plates can be used with the present invention. Also, in a preferred embodiment, tap 1 is an addressable multiple port tap that permits an operator to control the function of each connection port 14 from a system control center that is remote from the tap 1. For example, as known in the cable TV industry, addressable taps allow the service to an individual connection port 14 to be turned on or off without effecting the operation of the remaining connection ports 14. This is especially useful if there is a problem in one of the connection ports 14 or if subscribers have not paid their bills.

Figure 2:
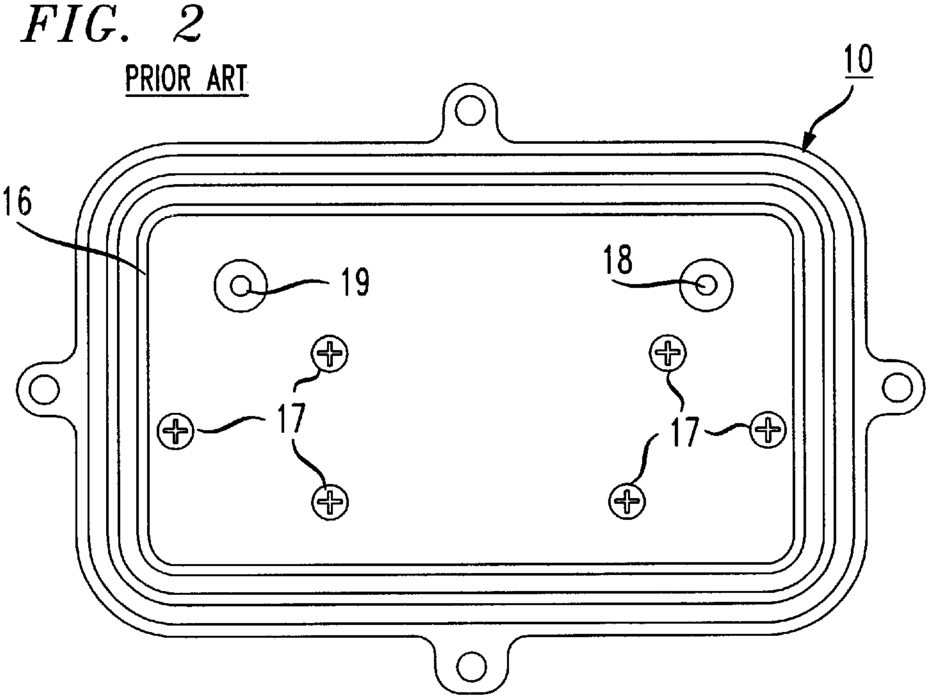
FIG. 2 PRIOR ART
FIG. 2 illustrates an inner surface of a cover plate having a circuit board for a multiple port tap according to the present invention.

As shown in FIG. 2, the inner face 16 of cover plate 10 includes a main printed circuit board 15 secured thereto via mounting screws 17. Individual electrical connections (not shown) are made between circuitry on main circuit board 15 and the connection ports 14, respectively, for providing attenuated voice, video, data and cable TV signals to each of the ports 14. FIG. 2 also shows the top of an electrical connection post 18 located at the RF signal and AC power output of circuit board 15, and the electrical connection post 19 located at the RF signal and AC power input of circuit board 15.

FIG. 3 illustrates the interior 8 of the tap housing 2 with the tap cover plate 10 removed. The seizure socket assembly housings 22 of known multi-tap devices are shown in FIG. 3. These seizure socket assembly housings 22 are mounted in recess 8 via mounting bosses 24 and the mounting screws 25, as shown, and are associated with their respective ports 3–6 during operation for receiving and outputting the RF signal and AC power downstream. Holes 26 are provided in the tops of the seizure socket assembly housings 22 for providing access to seizure sockets 28. Each hole 26 includes a seizure socket spring insert 29 formed of a conductive material for receiving and contacting a respective one of the electrical connection post 18 and 19, as is well known in the art, for connecting the input and output main feeding cables to the circuit board 15. As is also known in the art, the main RF signal for attenuation by circuit board 15 and delivery to connection port 14 is derived from the signal brought in on electrical connection post 19. The main feeding cable extending into input port 3 and the main feeding cable extending from output port 4 are secured to their respective seizure socket assemblies 22 by screw 30, in a well known manner, such as that disclosed in U.S. Pat. No. 5,677,578 to Tang, hereby incorporated by reference.

In a preferred embodiment of the present invention, a bypass 40 is used to provide uninterrupted signal and power to the downstream taps and subscribers when cover plate 10 has been removed for servicing. Bypass 40 includes first and second cables 41, 42, each having first and second ends 44, 45, respectively. Each first end 44 includes an exposed section of wire or fiber 47 and a well known, rotatable, threaded member 46 for coupling the cables 41, 42 to tap 1. The second end 45 of each cable 41, 42 is secured within a variable attenuator 43. Variable attenuator 43 matches the impedance of bypass 40 with the impedance of tap 1. Typically, the impedance of the tap 1 is indicated on the outer face 13 of its cover plate 10. By matching the impedance value of bypass 40 to the impedance value of tap 1, no distortion or reduction in signal strength will be experienced by downstream subscribers while the tap 1 is being serviced. Bypass 40 initially includes an open circuit that is closed by switch 49 when bypass 40 is in use.

Variable attenuator 43 can include an adjustable RC circuit, an adjustable RLC circuit or any other known variable signal attenuator that will prevent distortion of the RF signal, protect against noise or other interferences and protect against current or power surges. The benefits of a variable attenuator include the ability to use the same bypass 40 for servicing multiple taps with different impedance values. For example, bypass 40 could be used with a tap having a 5K impedance and then reset and used with a tap having a 20K impedance.

Figure 4:
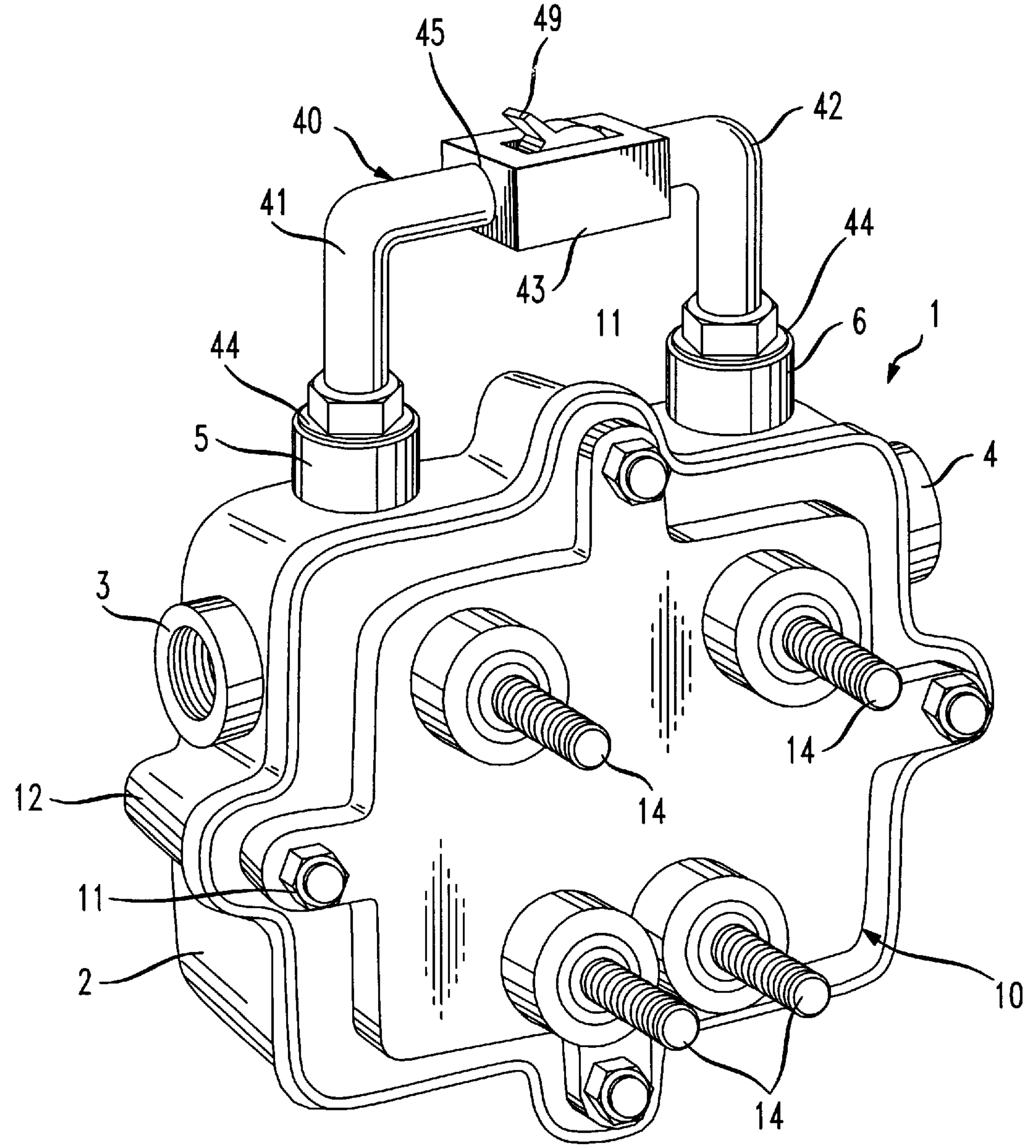
FIG. 4 illustrates the multiple port tap of FIG. 1 having an external bypass attached thereto according to the present invention.
Figure 5:
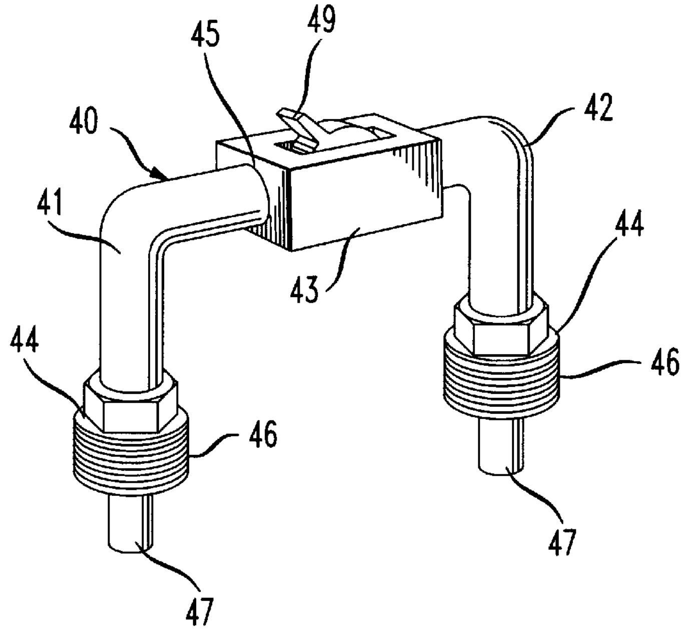
FIG. 5 illustrates the external bypass of FIG. 4.
Figure 6:
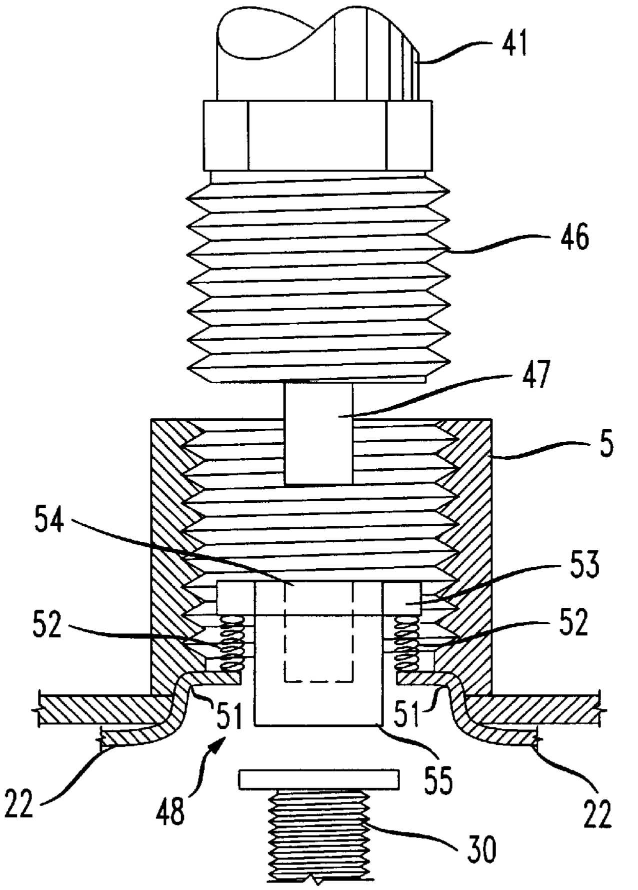
FIG. 6 illustrates an end of the external bypass of FIG. 4 before connection to the multiple port tap of FIG. 1 with a portion of the tap housing being broken away.
Figure 7:
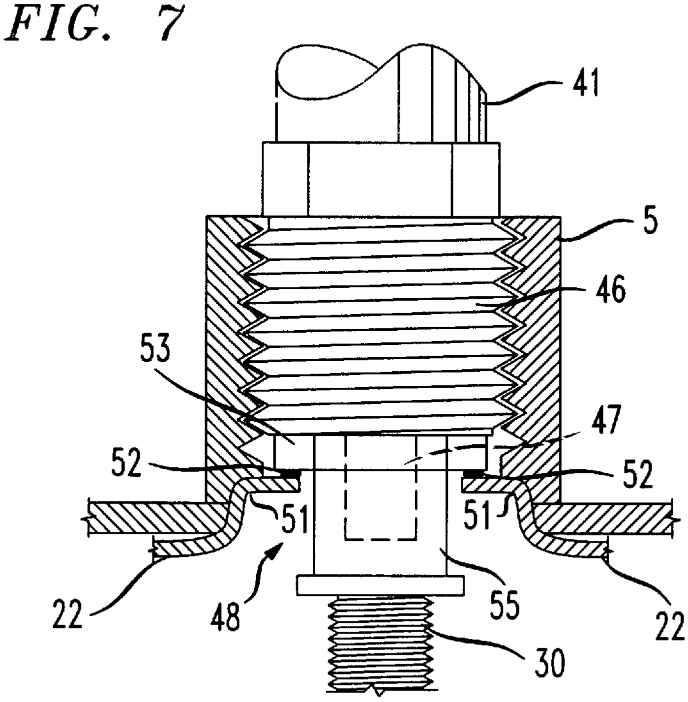
FIG. 7 illustrates an end of the external bypass of FIG. 4 coupled to the multiple port tap of FIG. 1 with a portion of the tap housing being broken away.

FIGS. 4, 6 and 7 illustrate one way in which bypass 40 can be connected to tap 1. In this embodiment, each seizure socket assembly 22 includes a shoulder 51 extending across the lower opening 48 of its respective bypass port 5, 6. A pair of springs 52 are secured to each shoulder 51 and extend into a respective bypass port. Within each bypass port, a cable receiving housing 53 is secured to and supported by springs 52. Springs 52 have a spring coefficient sufficient to bias housing 53 away from the seizure socket when the bypass cable is not positioned within the respective bypass port 5, 6. Each housing 53 includes a female end 54 formed of a conductive material into which the exposed wire 47 of the bypass cable is inserted and a male end 55, also formed of a conductive material. Male end 55 extends toward its respective seizure socket assembly 22 for contacting screw 30 and establishing a continuous flow path.

In use, the bypass 40 is installed in the bypass ports 5, 6 before trap 1 is serviced. As shown in FIG. 7, each threaded member 46 engages the inner threads of its respective bypass port 5, 6. As the threaded member is advanced within the bypass port, the exposed portion of the cable 47 is received within an opening 56 in housing 53. An inner face of threaded member 46 engages with housing 53 and forces its male end 55 into contact with screw 30, thereby establishing a path for the RF signal and AC current to travel. Because members 46 are threadably secured within their respective ports 5, 6, male end 55 of housing 53 winl not lose contact with screw 30 until the intended removal of bypass 40 begins. The threaded portion of each bypass port 5, 6 is greater than the distance between the male end 55 of each housing 53 and screw 30 so that housing 53 will be always be forced into engagement with screw 30 by the advancement of member 46. Bypass 40 is installed and cover plate 10 can be removed when the male end 55 of each housing 43 is securely in contact with its respective screw 30. Switch 49 is closed before or as cover plate 10 is removed so that the activation of bypass 15 and the removal of cover plate 10 occur sequentially or simultaneously. An LED or other type of indicator can be included on bypass 15 to indicate that RF signal and AC power are flowing through bypass 15. Bypass 15 can also be connected to screws 30 using alligator clips or other well known biased gripping members that can be connected to the end of a wire 47.

Figure 8:
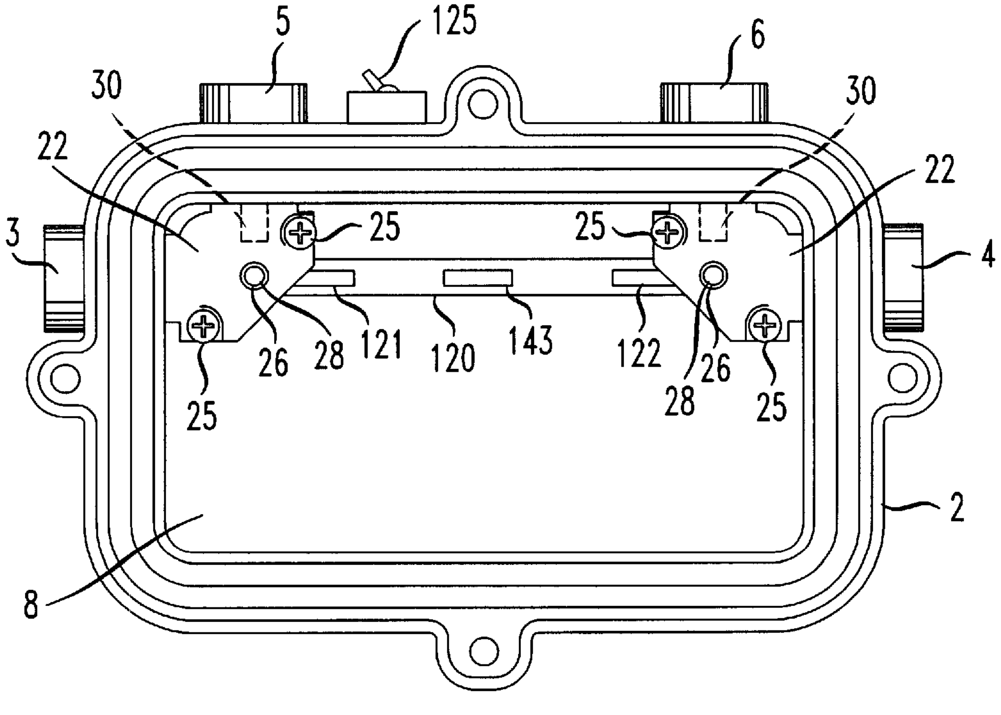
FIG. 8 illustrates a second embodiment of the interior of a multiple port trap housing according to the present invention.
Figure 9:
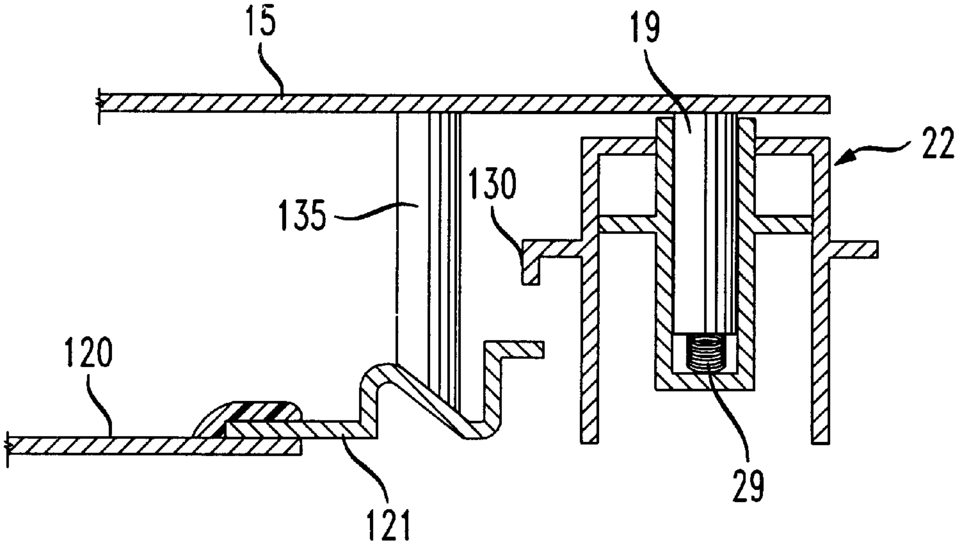
FIG. 9 illustrates portions of the circuit board of FIG. 2 in contact with the circuit board of FIG. 8 according to one embodiment of the invention.
Figure 10:
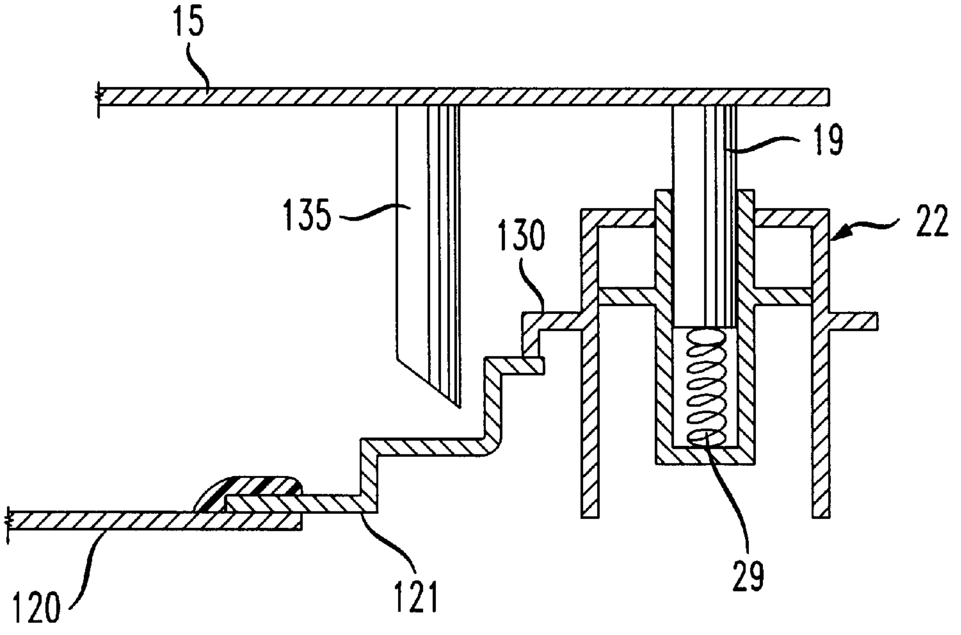
FIG. 10 illustrates portions of the circuit board of FIG. 2 being disconnected from the circuit board of FIG. 8, according to the embodiment of the invention shown in FIG. 9.

Another preferred embodiment for continuously providing RF signal and AC power to the downstream taps and subscribers is shown in FIGS. 8–10. Elements that are common between this embodiment and that discussed above will be indicated by the same reference numerals. In this embodiment, a bypass circuit board 120 secured within interior recess 8 of housing 2 provides RF signal and AC power to the downstream taps and subscribers when cover plate 10 is removed.

As shown in FIG. 8, bypass circuit board 120 has first and second conductive ends 121 and 122, respectively. Each end 121, 122 is rigidly connected to a conductive portion 130 of one of the seizure socket assembly housings 22 for providing continuous, attenuated, downstream service while tap 1 is being serviced. Circuit board 120 includes an open circuit controlled by an external switch 125. Therefore, circuit board 120 will not conduct the RF signal or AC power unless switch 125 is closed. In order to provide continuous downstream transmissions, switch 125 must be closed before or at the same time that cover plate 10 is removed from housing 2. Closing switch 125 before the cover plate is removed will ensure that continuous service is provided to the downstream subscribers. Circuit board 120 includes a variable attenuator 143 that is similar to variable attenuator 43 and offers the benefits discussed above with respect to attenuator 43. Like attenuator 43, variable attenuator 143 provides and maintains the predetermined impedance across tap 1 so that no interruption of the RF signal and power being transmitted to active downstream elements occurs. Also, attenuator 143 is variable so that the same circuit board can be adjusted for use with taps having different impedance values. A shield (not shown) can be positioned between bypass circuit board 120 and main circuit board 15 for isolating these boards when the tap is closed.

Alternatively, bypass circuit board 120 can be positioned within recess 8 so that its conductive ends 121, 122 are moveable relative to a conductive portion 130 of seizure socket assembly housings 22. In this embodiment, cover plate 10 and main circuit board 15 keep bypass circuit board 120 from making contact with seizure socket assembly housings 22 when tap 1 is closed. As a result, instantaneous switching of the signal and power to circuit board 120 occurs when cover plate 10 is removed. The following description is equally applicable to end 122 and its connection to a respective one of the seizure socket assembly housings 22. As shown in FIG. 9, end 121 extends from circuit board 120 in the direction of seizure socket assembly housing 22. End 121 is formed of a resilient metal for creating a flow path between conductive portion 130 and board 120. When the cover 10 and main circuit board 15 are secured to housing 2, electrical connection post 19 is received within spring insert 29. At the same time, a rigid member 135 extending from circuit board 15 and cover 10 contacts end 121 and deflects it away from conductive portion 130. As cover 10 is being removed, rigid member 135 moves away from end 121 and allows it to contact conductive portion 130, as shown in FIG. 10. As end 121 contacts conductive portion 130 and creates a circuit, connection post 19 is still in contact with spring insert 29. The circuit between connection post 19 and spring insert 29 is not broken until after the circuit between the circuit board 120 and conductive portions 130 has been established. This ensures that the downstream service will not be interrupted. A similar connection between the ends of circuit board 120 and the seizure socket assembly housings 22 is discussed in Tang, which has been incorporated by reference.

Figure 14:
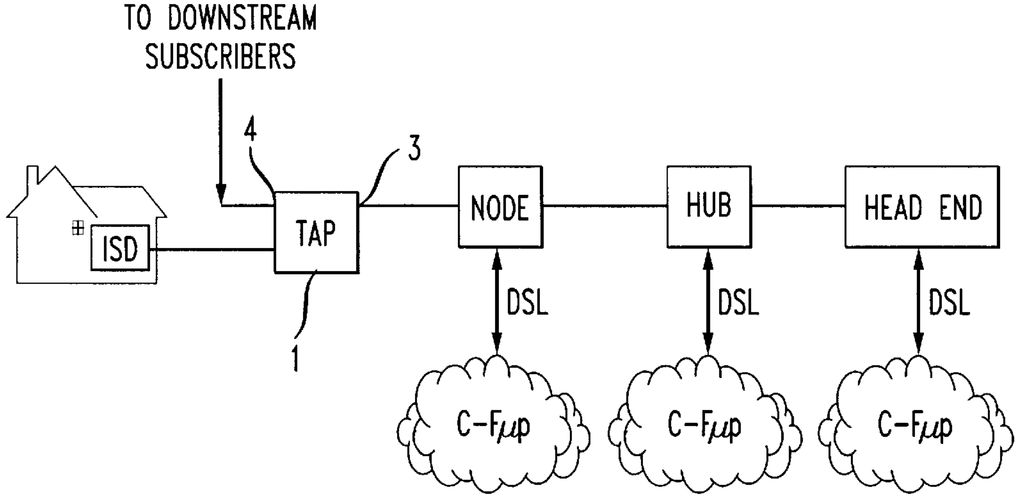
FIG. 14 the one of the multiple port taps according to the present invention in a communication system.

In any of the above discussed embodiments, multiple port tap 1 can be connected to an intelligent service director (ISD), as shown in FIG. 14 or include an ISD that cooperates with and is carried by circuit board 15. Other positions for the ISD have been considered, such as on circuit board 120. Suitable ISD's are disclosed in the concurrently filed U.S. patent applications listed below, which are incorporated by reference.

Figure 11:
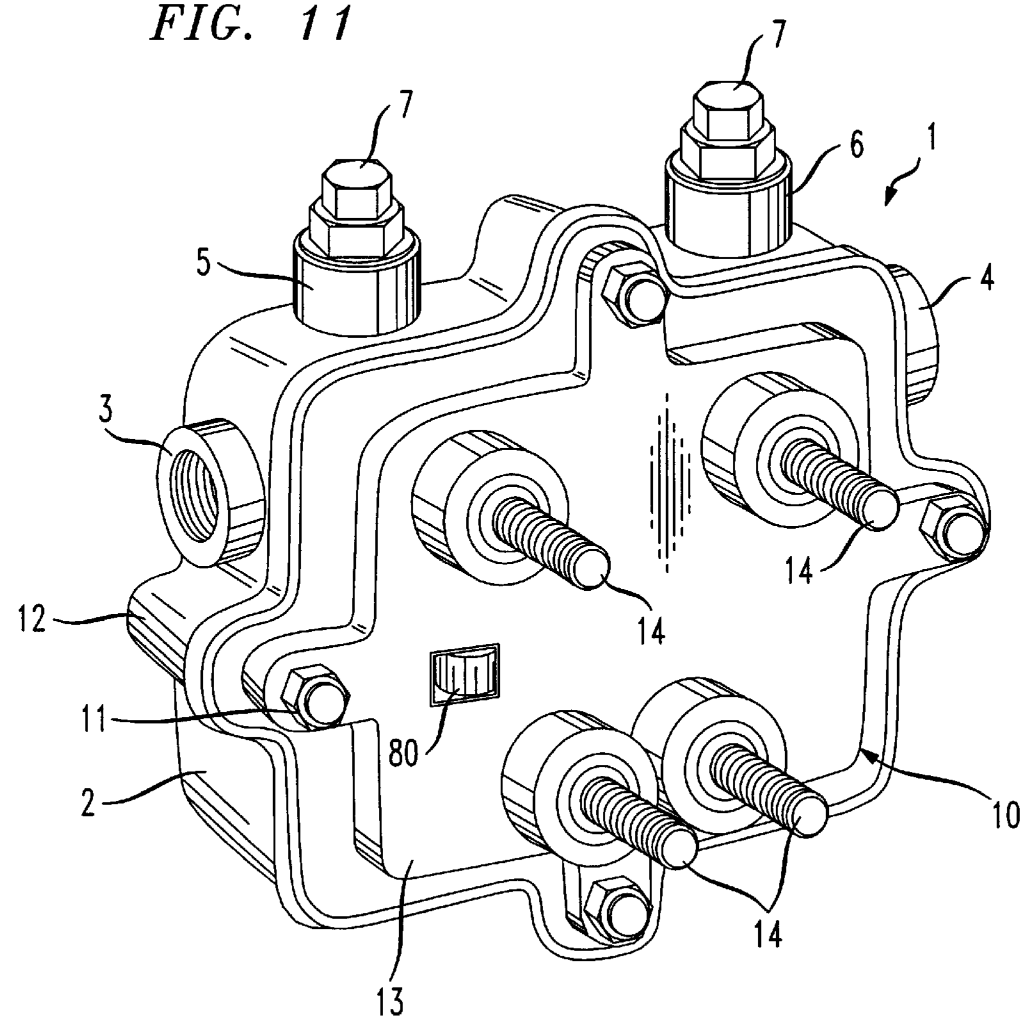
FIG. 11 illustrates a multiple port tap according to a second embodiment of the present invention.

Also, in any of the above discussed embodiments, cover plate 10 or housing 2 can include a service port 80, as shown in FIG. 11, that allows a field technician to interface with an active tap 1 and perform maintenance on the tap 1 without removing cover plate 10. Service port 80 is operatively coupled with circuit board 15 so that a technician can externally access board 15 and perform diagnostic procedures on the tap while plate 10 remains on housing 2. Such procedures include determining why the tap does not respond to a command issued from the main control station of the system. Service port 80 also allows a field technician to interface with the tap and the variable attenuator of circuit board 120 for adjusting the impedance of circuit board 120 before or after the cover plate 10 is removed. It is preferred that service port 80 includes a coaxial cable hookup for allowing the technician to interface with tap 1 and circuit board 15. RJ 45 and RJ 11 type jacks or other known connectors, jacks or diagnostics interfaces may be used to interface with circuit board 15. Adjusting the impedance of board 120 while board 15 is still secured to housing 2 and performing its intended function prevents the signal interruption that would occur if board 120 could only be adjusted with cover 10 removed.

Figure 12:
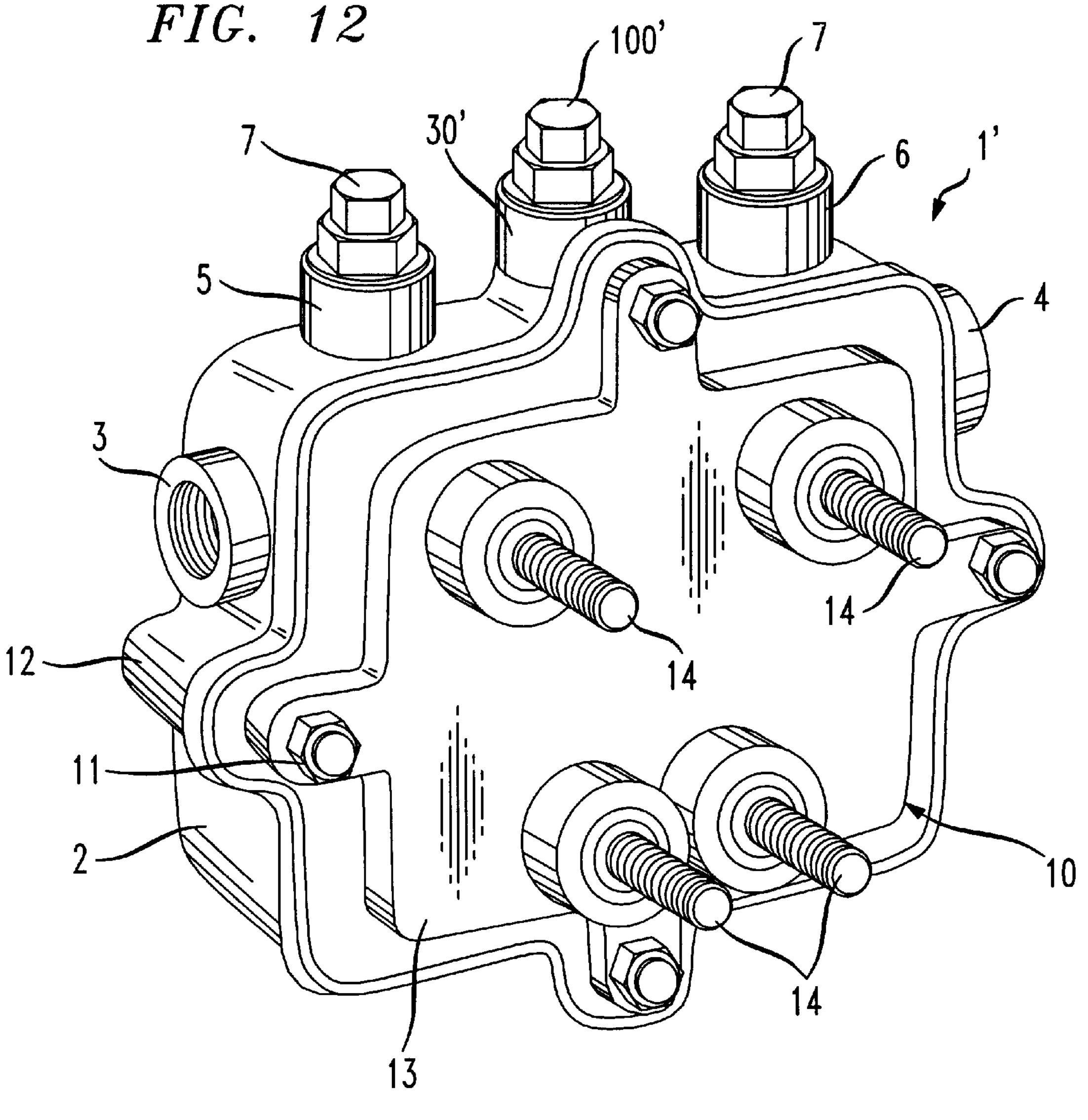
FIG. 12 illustrates a multiple port tap according to a third embodiment of the present invention.
Figure 13:
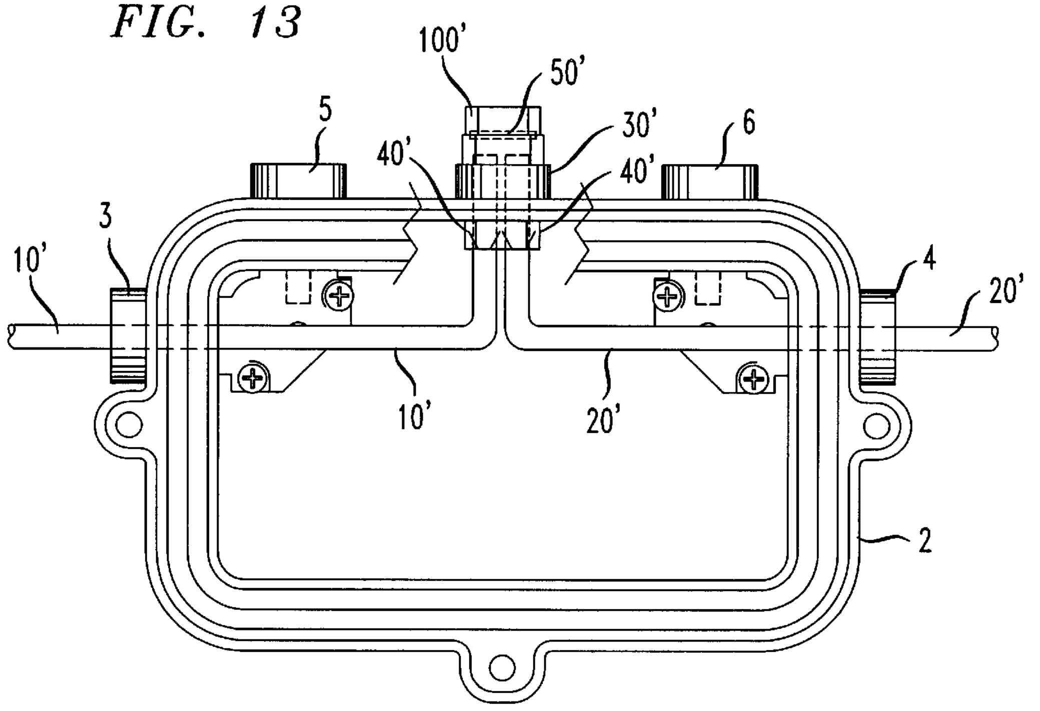
FIG. 13 is a diagram of the multiple port tap of FIG. 12.

FIGS. 12 and 13 illustrate another preferred embodiment of a tap according to the present invention includes a removable cap 100' for providing a predetermined level of impedance. In this embodiment, addressable tap 1' is similar to addressable tap 1 except for the manner in which the value of the impedance is set and provided. Each cap 100' includes a well known attenuation circuit for providing a predetermined load equivalent to the value indicated on the face plate of tap 1'. Like tap 1, the main signal feeding line 10' extends into tap 1' through input port 3, and main signal and power feeding line 20' extends out through output port 4. However, unlike tap 1, these lines 10', 20' are not secured to seizure socket assemblies and are instead secured to a cap receiving port 30'. When the proper cap is inserted into port 30' and the upstream line 10' and downstream line 20' are received in a respective one of the connectors 40' in port 30', lines 10' and 20' are operatively coupled together by the RC circuit 50' in cap 100'. The other impedance circuits mentioned above with respect to the other tap embodiments may also be used in cap 100'. It is contemplated that tap 100' can include a variable attenuator. The caps 100' can be designed to have different impedance values. Caps 100' can also be color coded to indicate their particular impedance value. Color coding the caps enables a field technician to determine the value of a cap after its numerical designation has worn away. This allows for the proper impedance to be easily and quickly provided to the tap 1' by replacing a cap 100' with a new cap having the same or a different impedance value, depending of the purpose of the cap replacement. The use of color coded caps allows the impedance in a tap to be changed or re-established with a minimal amount of time and effort being spent.

The embodiments for a multiple port tap described above can be used in the telecommunications systems discussed in the applications listed below, each listed application being hereby expressly incorporated by reference.

The following applications are hereby incorporated by reference:I

1. A Hybrid Fiber Twisted-pair Local Loop Network Service Architecture, U.S. application Ser. No. 09/001,360, filed Dec. 31, 1997;
2. Dynamic Bandwidth Allocation for use in the Hybrid Fiber Twisted-pair Local Loop Network Service Architecture, U.S. application Ser. No. 09/001,425, filed Dec. 31, 1997;
3. The VideoPhone, U.S. application Ser. No. 09/001,905, filed Dec. 31, 1997;
4. VideoPhone Privacy Activator, U.S. application Ser. No. 09/001,909, filed Dec. 31, 1997;
5. VideoPhone Form Factor, U.S. application Ser. No. 09/001,583 filed Dec. 31, 1997;
6. VideoPhone Centrally Controlled User Interface With User Selectable Options, U.S. application Ser. No. 09/001,576, filed Dec. 31, 1997;
7. VideoPhone User Interface Having Multiple Menu Hierarchies, U.S. application Ser. No. 09/001,908, filed Dec. 31, 1997;
8. VideoPhone Blocker, U.S. Pat. No. 5,949,474, issued on Sep. 7, 1999;
9. VideoPhone Inter-com For Extension Phones, U.S. application Ser. No. 09/001,358, filed Dec. 31, 1997;

10. Advertising Screen Saver, U.S. Pat. No. 6,084,583, issued on Jul. 4, 2000;
11. VideoPhone FlexiView Advertising Information Display for Visual Communication Device, U.S. Pat. No. 6,222, 520, issued on Apr. 24, 2001;
12. VideoPhone Multimedia Announcement Answering Machine, U.S. application Ser. No. 09/001,911, filed Dec. 31, 1997;
13. VideoPhone Multimedia Announcement Message Toolkit, U.S. application Ser. No. 09/001,345, filed Dec. 31, 1997;
14. VideoPhone Multimedia Video Message Reception, U.S. application Ser. No. 09/001,362, filed Dec. 31, 1997;
15. VideoPhone Multimedia Interactive Corporate Menu Answering Machine U.S. Pat. No. 6,226,362, issued on May 1, 2001; Announcement,
16. VideoPhone Multimedia Interactive On-Hold Information Menus, U.S. Pat. No. 6,020,916, issued on Feb. 1, 2000;
17. VideoPhone Advertisement When Calling Video Non-enabled VideoPhone Users, U.S. application Ser. No. 09/001,361, filed Dec. 31, 1997;
18. Motion Detection Advertising, U.S. application Ser. No. 09/001,355, filed Dec. 31, 1997;
19. Interactive Commercials, U.S. Pat. No. 6,178,446, issued on Jan. 23, 2001;
20. Video communication device providing in-home Catalogue Services, U.S. Pat. No. 5,970,473, issued on Oct. 19, 1999;
21. A Facilities Management Platform For Hybrid Fiber Twisted-pair Local Loop Network, Service Architecture, U.S. application Ser. No. 09/001,422, filed Dec. 31, 1997;
22. Life Line Support for Multiple Service Access on Single Twisted-pair, U.S. application Ser. No. 09/001,343, filed Dec. 31, 1997;
23. A Network Server Platform (NSP) For a Hybrid Fiber Twisted-pair (HFTP) Local Loop Network Service Architecture, U.S. Pat. No. 6,229,810, issued on May 8, 2001;
24. A Communication Server Apparatus For Interactive Commercial Service, U.S. application Ser. No. 09/001, 344, filed Dec. 31, 1997;
25. NSP Multicast, PPV Server NSP Based Multicast Digital Program Delivery Services, U.S. application Ser. No. 09/001,580, filed Dec. 31, 1997;
26. NSP Internet, JAVA Server and VideoPhone Application Server, U.S. Pat. No. 6,044,403, issued on Mar. 28, 2000;
27. NSP WAN Interconnectivity Services for Corporate Telecommuters Telecommuting, U.S. application Ser. No. 09/001,540, filed Dec. 31, 1997;
28. NSP Telephone Directory White-Yellow Page Services, U.S. Pat. No. 6,052,439, issued on Apr. 18, 2000;
29. NSP Integrated Billing System For NSP services and Telephone services, U.S. application Ser. No. 09/001,359, filed Dec. 31, 1997;
30. Network Server Platform/Facility Management Platform Caching Server, U.S. application Ser. No. 09/001,419, filed Dec. 31, 1997;
31. An Integrated Services Director (ISD) Overall Architecture, U.S. application Ser. No. 09/001,417, filed Dec. 31, 1997;
32. ISD/VideoPhone (Customer Premises) Local House Network, U.S. application Ser. No. 09/001,418, filed Dec. 31, 1997;
33. ISD Wireless Network, U.S. application Ser. No. 09/001, 363, filed Dec. 31, 1997;
34. ISD Controlled Set-Top Box, U.S. application Ser. No. 09/001,424, filed Dec. 31, 1997;
35. Integrated Remote Control and Phone, U.S. application Ser. No. 09/001,423, filed Dec. 31, 1997;
36. Integrated Remote Control and Phone User Interface, U.S. application Ser. No. 09/001,420, filed Dec. 31, 1997;
37. Integrated Remote Control and Phone Form Factor, U.S. application Ser. No. 09/001,910, filed Dec. 31, 1997;
38. VideoPhone Mail Machine, U.S. application Ser. No. 60/070,104, filed Dec. 31, 1997;
39. Restaurant Ordering Via VideoPhone, U.S. application Ser. No. 60/070,121, filed Dec. 31, 1997;
40. Ticket Ordering Via VideoPhone, U.S. application Ser. No. 09/218,171, filed Dec. 31, 1997;
41. Multi-Channel Parallel/Serial Concatenated Convolutional Codes And Trellis Coded Modulation Encode/Decoder, U.S. Pat. No. 6,088,387, issued on Jul. 11, 2000;
42. Spread Spectrum Bit Allocation Algorithm, U.S. application Ser. No. 09/001,842, filed Dec. 31, 1997;
43. Digital Channelizer With Arbitrary Output Frequency, U.S. application Ser. No. 09/001,581, filed Dec. 31, 1997;
44. Method And Apparatus For Allocating Data Via Discrete Multiple Tones, U.S. Pat. No. 6,134,274, issued on Oct. 17. 2000;
45. Method And Apparatus For Reducing Near-End Cross Talk In Discrete Multi-Tone Modulators/Demodulators, U.S. application Ser. No. 08/997,176, filed Dec. 23. 1997;

In addition, the following two earlier filed patent applications are hereby incorporated by reference:

1. U.S. Pat. No. 6,061,326 issued on May 9, 2000, entitled Wideband Communication System for the Home, to Robert R. Miller, II and Jesse E. Russell, and
2. U.S. Pat. No. 6,111,895 issued on Aug. 29, 2000, entitled Wide Band Transmission Through Wire, to Robert R. Miller, II, Jesse E. Russell and Richard R. Shively.

The following patent applications are related by subject matter and are concurrently filed herewith (the first listed application being the present application), and hereby incorporated by reference:

1. U.S. application Ser. No. 09/224,289, entitled "Method and Apparatus for Providing Uninterrupted Service in a Hybrid Fiber Coaxial System" by Gerszberg et al.
2. U.S. application Ser. No. 09/224,286, entitled "Set Top Integrated Visionphone User Interface Having Multiple Menu Hierarchies" of Gerszberg et al.
3. U.S. application Ser. No. 09/224,281, entitled "Coaxial Cable/Twisted Pair Fed, Integrated Residence Gateway Controlled, Set-top Box" of Gerszberg et al.
4. U.S. application Ser. No. 09/224,285, entitled "A Network Server Platform (NSP) for a Hybrid Coaxial/Twisted Pair Local Loop Network Service Architecture" of Gerszberg et al.
5. U.S. application Ser. No. 09/224,287, entitled "A Facilities Management Platform for a Hybrid Coaxial/Twisted Pair Local Loop Network Service Architecture" of Gerszberg et al.
6. U.S. application Ser. No. 09/224,290, entitled "Intercom for Extension Phones Using an ISD in a Cable Environment" of Gerszberg et al.
7. U.S. application Ser. No. 09/224,288, entitled "Video Phone Multimedia Video Message Reception" of Gerszberg et al.
8. U.S. application Ser. No. 09/224,284, entitled "Cable Connected NSP for Telephone White-Yellow Page Services and Emergency 911 Location Identification" of Gerszberg et al.
9. U.S. application Ser. No. 09/224,282, entitled "A Network Server Platform for Providing Integrated Billing for CATV, Internet, Telephony and Enhanced Bandwidth Services" of Gerszberg et al.

10. U.S. application Ser. No. 09/224,283, entitled "Coaxial Cable/Twisted Pair Cable Telecommunications Network Architecture" of Gerszberg et al.
11. U.S. application Ser. No. 09/224,276, entitled "Lifeline Service for HFCLA Network Using Wireless ISD" of Gerszberg et al.

While exemplary systems and methods embodying the present invention are shown by way of example, it will be understood, of course, that the invention is not limited to these embodiments. Modifications may be made by those skilled in the art, particularly in light of the foregoing teachings. For example, each of the elements of the aforementioned embodiments may be utilized alone or in combination with elements of the other embodiments.

We claim:

1. A method of providing a continuous, attenuated feeder signal across a tap in a coaxial communication system while the tap is serviced, said method comprising the steps of:

a) providing a tap including a housing having an open top, a cover plate removably secured to said housing for closing said open top, an input signal connection member for receiving the feeder signal, an output signal connection member for outputting the feeder signal to a downstream element and a printed circuit board for carrying the feeder signal between said signal connection members;
b) providing a signal bypass having first and second ends, each said end for coupling to a respective one of said signal connection members, said signal bypass also including a variable attenuator positioned between said first and second ends;
c) coupling said first end of said signal bypass to said input signal connection member;
d) coupling said second end of said signal bypass to said output signal connection member so that the feeder signal will flow through said signal bypass when said bypass is activated;
e) setting said variable attenuator at a predetermined impedance level;
f) activating said signal bypass; and
g) disconnecting said circuit board from said signal connection members so that the feeder signal flows from said input signal connection member to said output signal connection member through said signal bypass.

2. The method of providing a continuous, attenuated feeder signal across a tap according to claim 1, wherein said step of setting said variable attenuator at a predetermined level of impedance includes setting said attenuator at an impedance level provided by said tap during normal operation thereof.

3. The method of providing a continuous, attenuated feeder signal across a tap according to claim 1, wherein said step of activating the bypass includes closing a switch positioned between the first and second ends of said bypass.

4. The method of providing a continuous, attenuated feeder signal across a tap according to claim 1, wherein said step of activating the bypass includes the step of removing the cover plate from the housing.

5. The method of providing a continuous, attenuated feeder signal across a tap according to claim 1 wherein said steps of coupling said first and second ends of said signal bypass to a respective one of said signal connection members include advancing the first end of said bypass into a first bypass port on said tap housing and advancing the second of said bypass into a second bypass port on said tap housing.

6. The method of providing a continuous, attenuated feeder signal across a tap according to claim 5, wherein said coupling steps further include coupling a lead extending from the first end of the bypass to a connector housing within a first bypass port and advancing the connector housing within said first bypass port until it contacts said input signal connection member.

7. The method of providing a continuous, attenuated feeder signal across a tap according to claim 6, wherein said coupling steps further include coupling a lead extending from the second end of the bypass to a connector housing within said second bypass port and advancing the connector housing within the second bypass port until it contacts said output signal connection member.

8. An external signal bypass for use with a multiple port tap having a main signal input connector and a main signal output connector in a coaxial communication system, said signal bypass comprising:

a) a first signal receiving end for coupling with the main signal input connector of the multiple port tap;
b) a second signal receiving end for coupling with the main signal output connector of the multiple port tap; and
c) a variable impedance attenuator positioned between the first and second signal receiving ends for delivering a predetermined signal and power to the main signal output connector of the multiple port tap when the tap is being serviced.

9. The external signal bypass according to claim 8 further including a switch positioned between said first and second ends.

10. The external signal bypass according to claim 8, wherein each said end includes a threaded member for coupling its respective end to a respective one of the main signal connectors.

11. A tap for providing continuous signal and power in a coaxial communication system while said tap is being serviced, said tap comprising:

a) a tap housing, means for receiving a main signal from an upstream element, means for outputting the main signal to a downstream element, circuitry for coupling said signal receiving means to said signal outputting means, said circuitry including a signal attenuator, and a housing cover plate having at least one subscriber connection port operatively coupled to said circuitry for delivering a signal to a subscriber; and
b) a signal and power bypass including a variable attenuator for coupling to said signal receiving means and signal outputting means and for providing a signal and power pathway around said circuitry so that uninterrupted service is provided to the downstream element when said tap is being serviced.

12. The tap for providing continuous signal and power in a coaxial communication system according to claim 11, wherein said main signal receiving means includes a housing having a conductive member for connecting to a line carrying the main signal during the operation of the tap.

13. The tap for providing continuous signal and power in a coaxial communication system according to claim 12, wherein said main signal outputting means includes a housing having a conductive member for connecting to a line carrying the main signal to a downstream element during the operation of the tap.

14. The tap for providing continuous signal and power in a coaxial communication system according to claim 11, wherein said bypass includes first and second ends, each said end having an exposed lead, and said housing further includes first and second bypass ports for receiving said first and second ends of said bypass, respectively.

15. The tap for providing continuous signal and power in a coaxial communication system according to claim 14 wherein said tap housing further includes a lead receiving member positioned within each of said first and second bypass ports, each said lead receiving member being movable within its respective bypass port and supported therein by a resilient member.

16. The tap for providing continuous signal and power in a coaxial communication system according to claim 15, wherein each said lead receiving member includes a lead receiving end and a conductive member contacting end, such that when a lead from said bypass is positioned in a respective one of said lead receiving members and advanced into a respective one of said bypass ports, said conductive member contacting end will move relative to its respective bypass port and engage a respective one of said signal receiving or outputting means.

17. The tap for providing continuous signal and power in a coaxial communication system according to claim 11 wherein at least a portion of said circuitry is secured to said housing cover plate.

* * * * *